(12) United States Patent
Crane, Jr. et al.

(10) Patent No.: US 6,305,987 B1
(45) Date of Patent: Oct. 23, 2001

(54) INTEGRATED CONNECTOR AND SEMICONDUCTOR DIE PACKAGE

(75) Inventors: Stanford W. Crane, Jr., Boca Raton; Lakshminarasimha Krishnapura, Delray Beach, both of FL (US); Arindum Dutta, Sidney, OH (US)

(73) Assignee: Silicon Bandwidth, Inc., Fremont, CA (US)

( * ) Notice: Subject to any disclaimer, the term of this patent is extended or adjusted under 35 U.S.C. 154(b) by 0 days.

(21) Appl. No.: 09/249,300

(22) Filed: Feb. 12, 1999

(51) Int. Cl.$^7$ ................................................ H01R 24/00

(52) U.S. Cl. ............................................ 439/676; 439/620

(58) Field of Search ............................ 439/79, 676, 620, 439/80, 638

(56) References Cited

U.S. PATENT DOCUMENTS

| | | | |
|---|---|---|---|
| 5,071,363 | 12/1991 | Reylek et al. | 439/291 |
| 5,081,563 | 1/1992 | Feng et al. | 361/414 |
| 5,330,372 | 7/1994 | Pope et al. | 439/692 |
| 5,376,825 | 12/1994 | Tukamoto et al. | 257/685 |
| 5,403,784 | 4/1995 | Hashemi et al. | 437/217 |
| 5,406,450 | * 4/1995 | Shieh | 439/638 |
| 5,541,449 | 7/1996 | Crane, Jr. et al. | 257/697 |
| 5,543,586 | 8/1996 | Crane, Jr. et al. | 174/262 |
| 5,575,688 | 11/1996 | Crane, Jr. | 439/660 |
| 5,634,821 | 6/1997 | Crane, Jr. | 439/660 |
| 5,641,309 | 6/1997 | Crane, Jr. | 439/660 |
| 5,659,953 | 8/1997 | Crane, Jr. et al. | 29/843 |
| 5,819,403 | 10/1998 | Crane, Jr. et al. | 29/841 |
| 5,982,624 | * 11/1999 | Onoda et al. | 439/638 |
| 5,984,731 | * 11/1999 | Laity | 439/676 |

FOREIGN PATENT DOCUMENTS

WO 00/21163    4/2000 (WO) .......................... H01R/24/10

* cited by examiner

Primary Examiner—Brian Sircus
Assistant Examiner—Hae Moon Hyeon
(74) Attorney, Agent, or Firm—Morgan, Lewis & Bockius LLP

(57) ABSTRACT

An integrated module includes a connector for detachable connection to a signal source, with the connector having internal electrically conductive pins, and a housing defining a cavity for holding at least one semiconductor die. The housing includes side walls and an end plate joined to the side walls. Electrically conductive leads extend through at least one of the side walls with each of the leads including an internal lead section extending within the cavity and an external lead section extending externally of the cavity through at least one side wall. One of the side walls of the housing includes a portion that is attached to the connector, with the side walls and a bottom part of the connector being formed as one integrally molded part or as two separate parts that are joined together using processes such as ultrasonic welding. A printed circuit board can also form part of the integrated module, with the printed circuit board either being mounted in spaced parallel relation to the end plate on pegs that extend upwardly from the side walls of the housing, or the printed circuit board can be mounted between the connector and the housing either perpendicular to or parallel with the end plate of the housing. Passive components can be mounted on the printed circuit board and electrically connected to pins within the connector as well as to semiconductor dies mounted on the end plate within the housing. The electrically conductive leads extending from the side wall on one side of the integrated module can be offset relative to the electrically conductive leads extending from the opposite side wall such that two identical integrated modules can be mounted close to each other with the electrically conductive leads overlapping, thus optimizing space utilization.

29 Claims, 17 Drawing Sheets

INTEGRATED CONNECTOR AND SEMICONDUCTOR DIE PACKAGE

BACKGROUND OF THE INVENTION

1. Field of the Invention

The present invention relates to an integrated module that includes a pluggable connector for interfacing with a signal source and a semiconductor die package.

2. Description of the Related Art

A semiconductor die or chip is an electrical component on which a microcircuit is built. The microcircuits can be interconnected together on a printed circuit board to form larger electrical circuits for use in computers, televisions, routers and various appliances, to name just a few. To permit the aforementioned devices to communicate with other devices, a signal received from a remote location is generally transmitted through an interface to the printed circuit board on which one or more semiconductor chips containing active components, such as transistors, are mounted. With computers and other data processing equipment, increases in speed lead to expanded capabilities in graphics, communications, and database applications, to name just a few.

In conventional electronic systems, the length of the wiring path between the interface or connector at which a remote signal is received and the active components within the microcircuit contained on the semiconductor chip contributes to signal noise and a reduction in the operation speed of the electronic system. As the operation speeds of IC dies increase, the propagation delay of signals passing between an interface at which the signals are received from a remote source and the IC dies in the electronic system becomes significant.

The assembly of conventional electronic systems including one or more connectors and semiconductor chips is complex and requires great precision in the placement of connectors providing the interface with incoming signals relative to the printed circuit board or substrate on which the connector is mounted. A standard modular jack-type connector may have 4, 8 or another number of internal electrically-conductive pins that extend through the connector and must be precisely positioned on pads at the ends of wire paths on a printed circuit board. One or more semiconductor chips may also be electrically connected to the printed circuit board.

Multi-chip modules, which are sometimes referred to as multi-chip carriers, have been proposed as a way to miniaturize electronic systems. Multi-chip modules are semiconductor die carriers that house multiple semiconductor IC dies. The multi-chip modules generally include an insulative housing that protects and supports the IC dies and a plurality of leads that extend from the housing to couple electrical signals to and from the IC dies.

The semiconductor die package includes a housing that holds the semiconductor die and conductive leads or pins that extend from the bottom or sides of the housing. The conductive leads are electrically connected to the semiconductor die within the housing. The outside ends of the leads are soldered to conductive paths on the printed circuit board. This secures the semiconductor die package to the printed circuit board and permits electrical signals to pass between the semiconductor die and other components on the printed circuit board.

In a conventional semiconductor die package, the housing encases the semiconductor die to prevent damage to the semiconductor die from exposure to the environment. The housing may be hermetically sealed, encased in plastic, or otherwise sealed against the environment.

A standard interface or connector for sending and receiving a signal from a remote source, receiving power, and transmitting the signal and the power to a printed circuit board includes modular jacks such as a RJ-45 type modular jack. In a typical application, such a standard modular jack is mounted on a printed circuit board and electrically connected through wire leads formed by conventional processes on the printed circuit board to a semiconductor chip that is wire bonded to pads on the printed circuit board at the ends of the wire leads. In addition to the detrimental effect on operation speed caused by the length of the wire path between the modular jack and the semiconductor chip, the manufacture of such conventional electronic systems is also complex and costly because of the requirement to position the standard modular jack and the semiconductor chips in the exact right position relative to the wire leads formed on the printed circuit board and as a result of the multiple components.

SUMMARY OF THE INVENTION

The present invention has been made in view of the above circumstances and has as an object to provide a simple and economical means of bringing the computing power of an integrated circuit or semiconductor chip close to an interface or detachable connector in an easily manufactured integrated module.

A further object of the present invention is to combine a housing for a semiconductor chip with a standard modular type connector in a manner that ensures the proper positioning of the modular connector and the semiconductor chip relative to each other for proper electrical connection therebetween.

Yet another object of the invention is to improve the signal quality received by an integrated circuit while minimizing signal distortion resulting from the length of electrical path between the connector or interface and the integrated circuit.

To achieve the objects and in accordance with the purpose of the invention, as embodied and broadly described herein, the invention comprises an integrated module having a connector for detachable connection to a signal source and a housing defining a cavity for holding at least one semiconductor die. The connector includes internal electrically conductive pins. The housing includes a plurality of insulative side walls and an end plate joined to the side walls. A plurality of electrically conductive leads extend through at least one of the side walls, with each of the leads including an internal lead section extending within the cavity of the housing and an external lead section extending externally of the cavity through the at least one side wall.

The invention further includes one of the side walls of the housing being connected with a portion of the connector, either as one unitary molded component or as two separate components that are joined by ultrasonic welding or other similar processes.

Some or all of the internal lead sections can be electrically connected to at least one semiconductor die or integrated circuit die mounted on the end plate within the housing.

In one preferred embodiment, the cavity in the housing on the integrated module is further defined between the insulated side walls, the end plate and an upper printed circuit board extending in substantially parallel, spaced relationship to the end plate, and supported on pegs protruding upwardly from at least one of the side walls and the end plate. In this embodiment, electrically conductive pins of the connector can be electrically connected to a first portion of the upper printed circuit board, with a group of the electrically conductive leads that extend through one of the side walls of the housing being electrically connected to a second portion of the upper printed circuit board.

In another preferred embodiment, the end plate can be formed from a heat sink material, such as copper. An electromagnetic shielding material can be provided around the outer periphery of the connector and the housing. The electromagnetic shielding material can be connected with the end plate in order to act as a heat spreader for heat generated by operation of electrical components on the at least one semiconductor die contained within the housing.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

DESCRIPTION OF THE PREFERRED EMBODIMENT

Reference will now be made in detail to the present exemplary embodiments illustrated in the accompanying drawings. Wherever possible, the same reference numbers will be used throughout the drawings to refer to the same or like parts.

Figure 1:
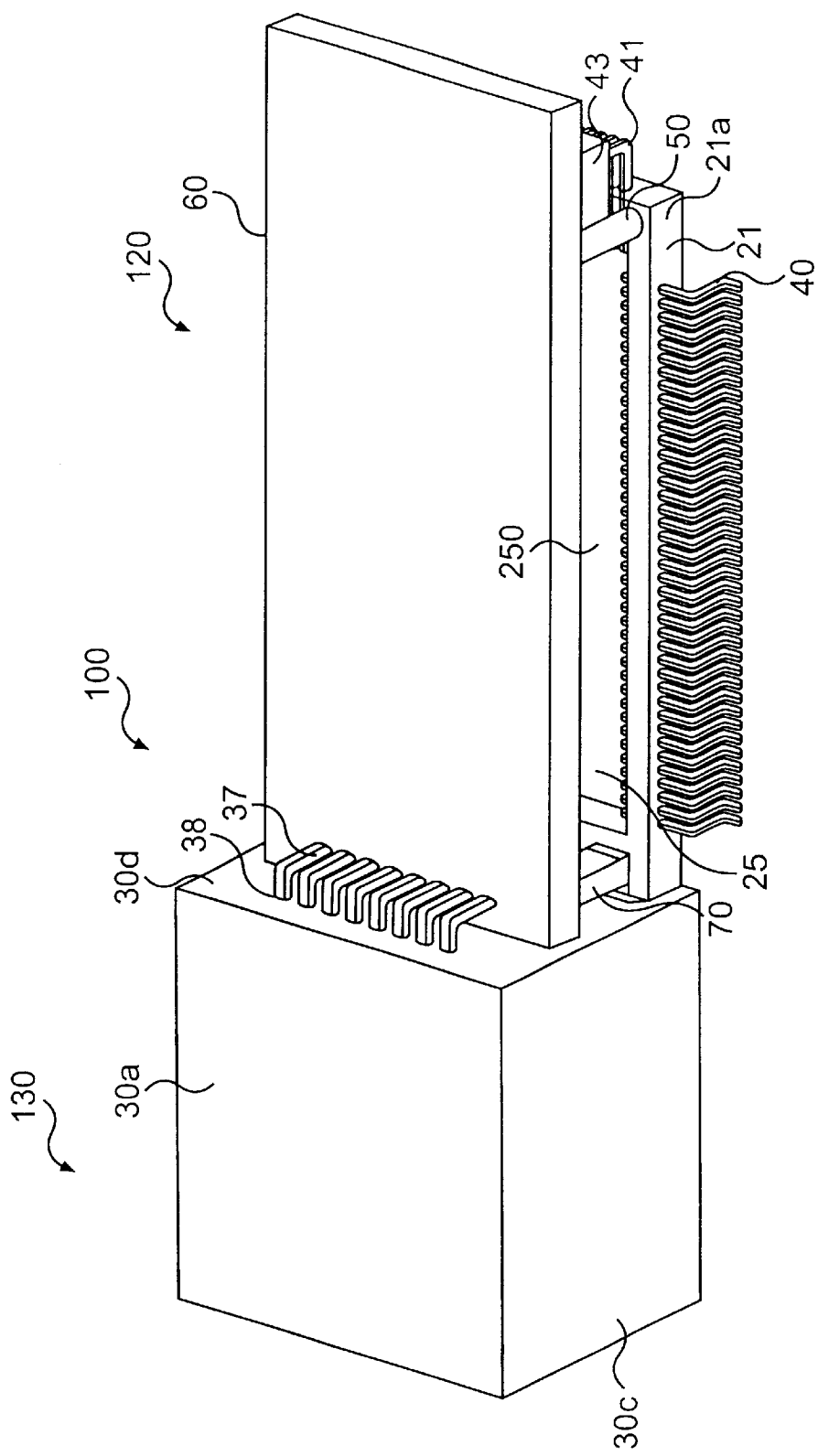
FIG. 1 illustrates an integrated module in accordance with a first embodiment of the invention.
Figure 2:
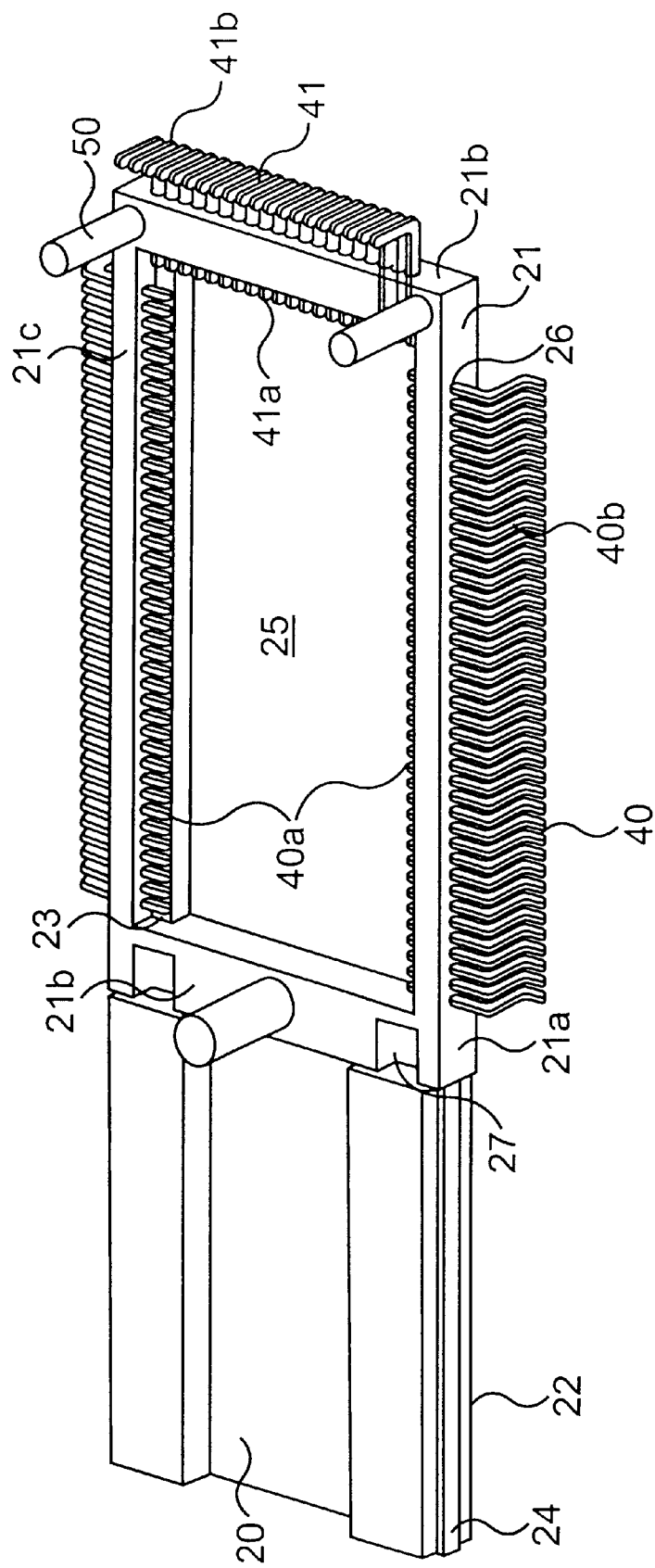
FIG. 2 illustrates a first assembly step in making the integrated module shown in FIG. 1.
Figure 3:
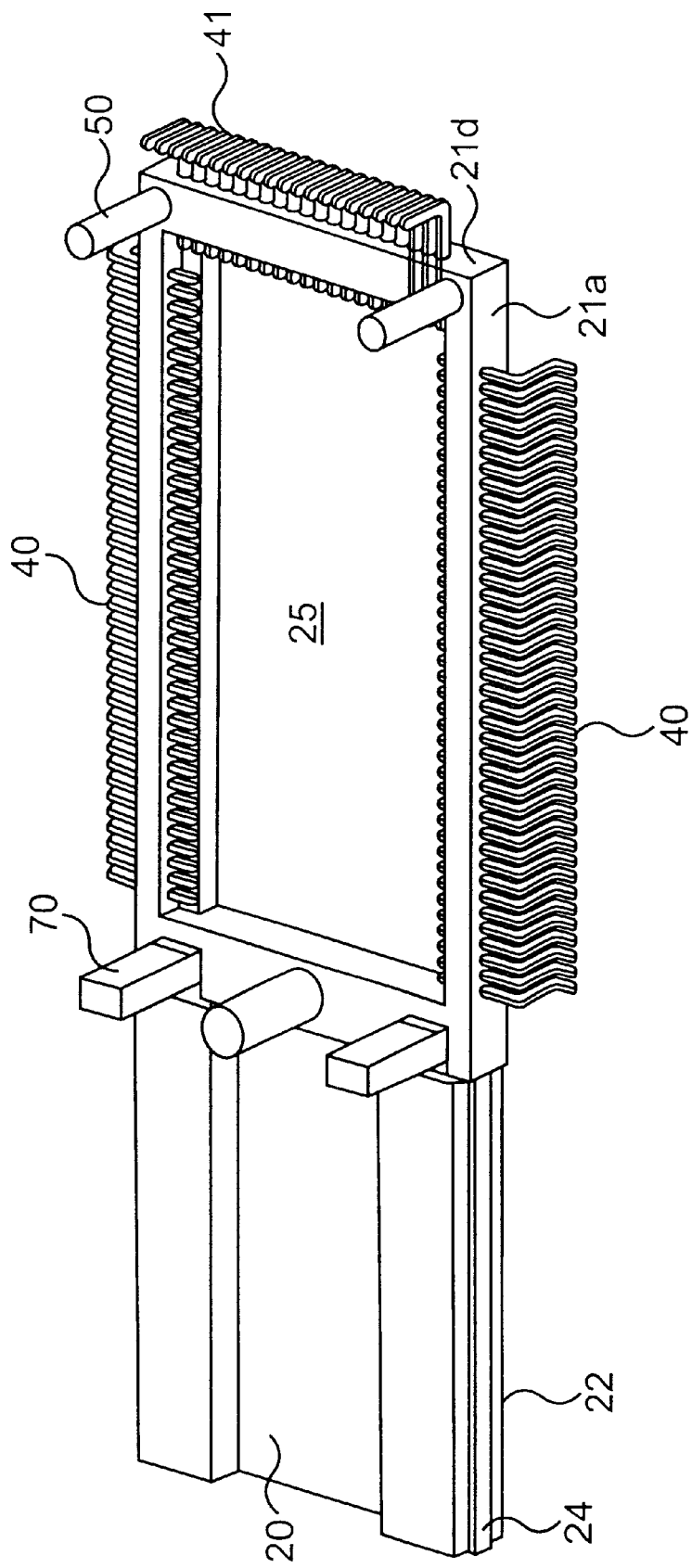
FIG. 3 illustrates a second assembly step in making the integrated module shown in FIG. 1.

FIG. 1 illustrates a first embodiment of the invention. FIGS. 2–5 show successive steps in the assembly of the embodiment shown in FIG. 1. As shown in FIG. 1, an integrated module 100 combines a connector 130 and a housing 120 for holding one or more semiconductor dies (not shown in FIG. 1). In the embodiment shown in FIG. 1, the housing 120 includes a plurality of side walls 21 and an end plate 25, and an upper printed circuit board 60 supported on pegs 50 protruding upwardly from side walls 21. As shown in FIGS. 1–4, leads 40 and 41 extend from the side walls 21 of housing 120. While FIG. 2 shows a single row of leads 40 extending from the side walls 21a and 21c, and a single row of leads 41 extending from side wall 21d of housing 120, the leads 40 and 41 may extend from any one or more of the side walls 21 and may extend from the side walls 21 in one or more rows.

A cavity 250 is defined within the interior of the housing 120. One or more semiconductor dies may be housed within the cavity 250, for example, by mounting to end plate 25 using a die-attach adhesive. Of course, semiconductor dies may be mounted within cavity 250 by means other than adhesive and may be mounted to structure other than the end plate 25. Electrically conductive material (not shown in FIGS. 1–5), such as bonding wire, tape automated bonding, jumpers, and/or other electrically conductive material, may be used to electrically connect the leads 40, 41 to the semiconductor dies contained within the cavity 250. Not all of the leads 40, 41 need to be electrically connected to the semiconductor dies. Some of the leads 40, 41 may not be connected to any electrically conductive element within the housing 120. The semiconductor dies housed within the cavity 250 may include one or more microprocessor dies; application specific integrated circuit (ASIC) dies; digital signal processing (DSP) dies; various sensor dies; memory dies, such as, but not limited to dynamic random access memory (DRAM), static random access memory (SRAM), video random access memory (VRAM), electrically erasable programmable read-only memory (EEPROMs), and flash memory, among others; semiconductor lasers or LEDs; charge-coupled devices; or other processing, logic and/or sensing dies, or any combination of these components.

Figure 6:
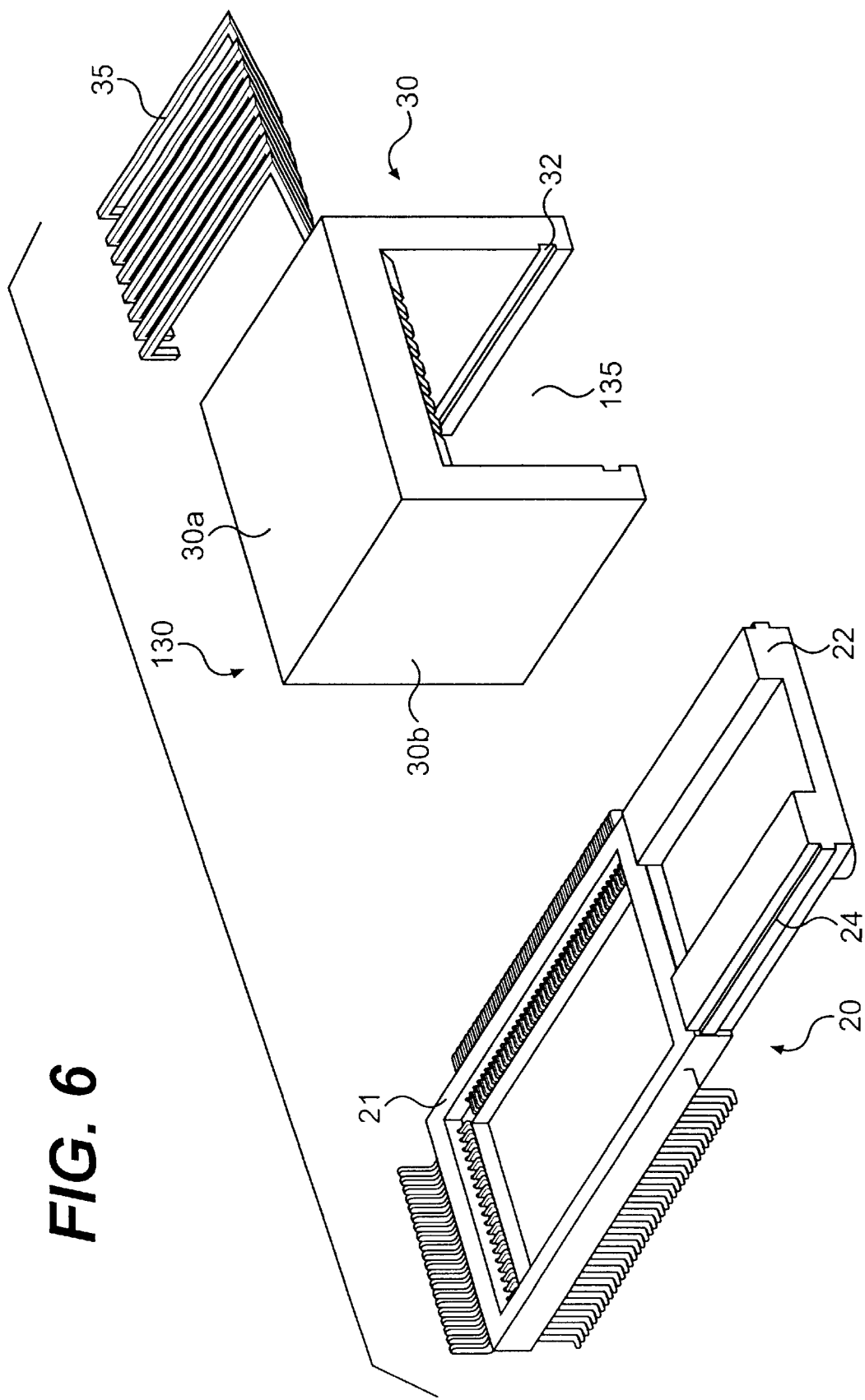
FIG. 6 illustrates an exploded view of the integrated module shown in FIG. 1.
Figure 7:
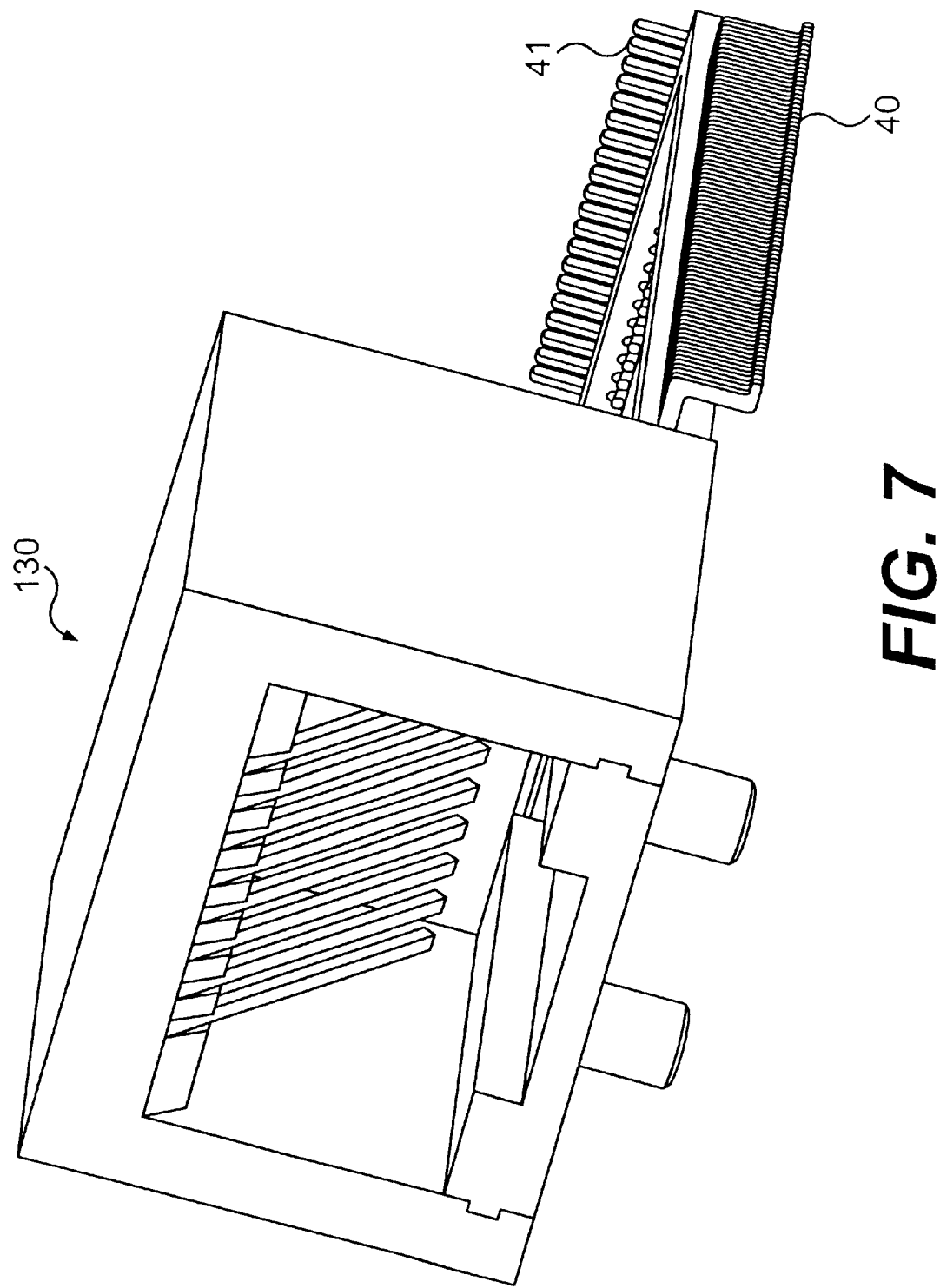
FIG. 7 illustrates the integrated module shown in FIG. 1 as viewed from the connector end of the module.

The connector 130 at one end of integrated module 100 can be a modular jack type connector having internal, angled, electrically conductive pins, as best seen in the exploded view of FIG. 6. An opening 135 into one side of the connector 130 provides access for a mating connector to engage with the electrically conductive pins 35.

In the embodiment shown in FIG. 1, and as best seen in FIGS. 2–4 and 6, the base portion 20 of the integrated module 100 is one continuous member that includes the side walls 21 of the housing 120 as well as the bottom part 22 of the connector 130. The base portion 20 of integrated module 100 can be molded as one integral piece of plastic, such as shown in FIG. 2, or can be assembled from more than one component using joining processes, such as ultrasonic welding, as will be described in more detail below.

Figure 5:
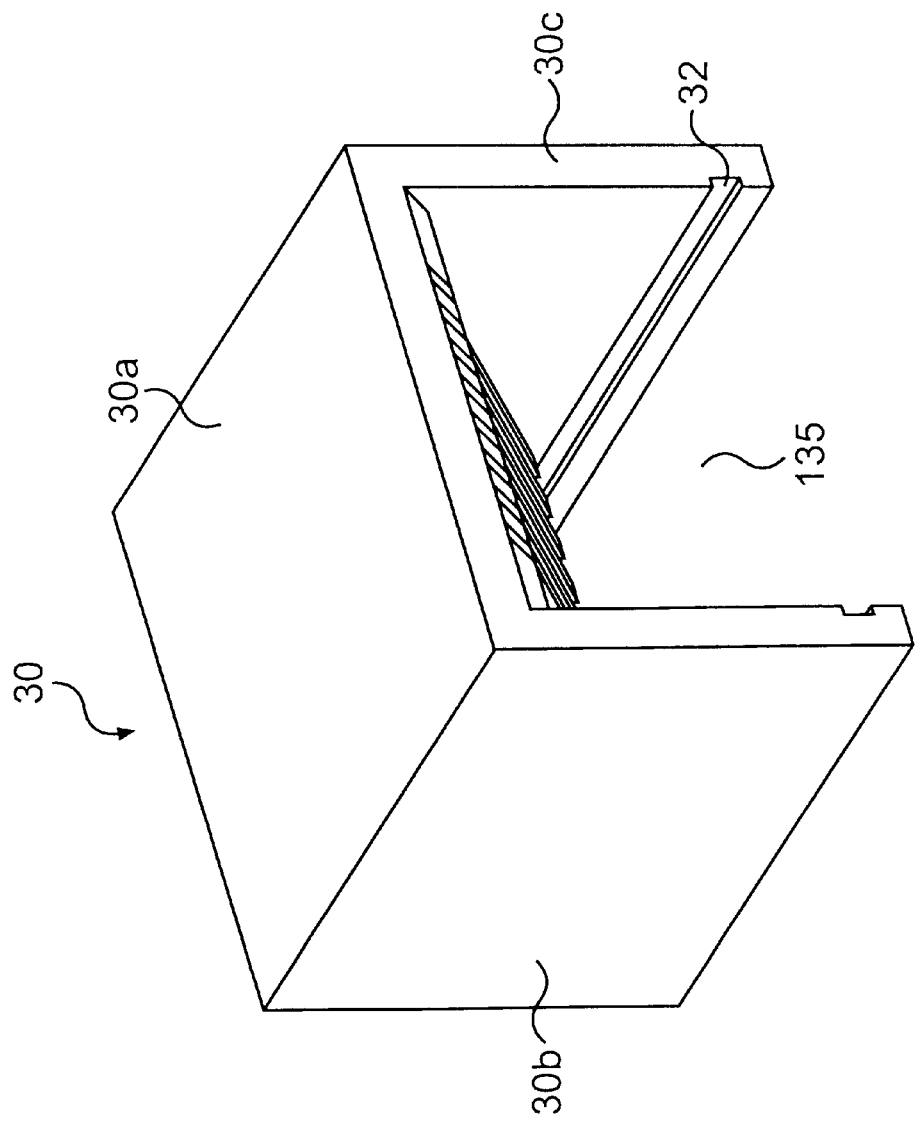
FIG. 5 illustrates the upper portion of a connector assembled to the integrated module shown in FIG. 1.

As shown in FIGS. 1, 5 and 6, the top part 30 of connector 130 includes a top wall 30a, side walls 30b and 30c, and a rear wall 30d opposite from the opening 135 into the front side of the connector 130. Longitudinally extending grooves 32 can be formed along lower portions of side walls 30b and 30c for engagement with ribs 24 that extend along the sides of lower part 22 of the base portion 20 of the integrated module 100. A group of electrically conductive leads 37 extend through openings 38 in the back wall 30d of connector 130. The electrically conductive leads 37 are electrically connected to the internal pins 35 within connector 130. The leads 37 are generally L-shaped and provide an electrical connection from the internal pins 35 of the connector 130 to electrical components mounted on the upper circuit board 60. The leads 37 can be integral with and extending from the internal pins 35. The electrical components mounted on the upper circuit board 60 can be passive components such as resistors, capacitors, and inductors, if required for purposes such as filtering noise from signals received by the connector 130. Alternatively, the upper circuit board 60 can include active components or a combination of active and passive components.

FIG. 1 provides a perspective view of the housing 120 and leads 40 and 41 of the integrated module 100. FIG. 2 is an intermediate assembly view of the integrated module 100 with the upper part 30 of connector 130 removed and with the upper circuit board 60 of housing 120 removed. As shown in FIGS. 1 and 2, the housing 120 includes side walls 21 and end plate 25 joined to the side walls, and an upper printed circuit board 60 mounted in parallel, spaced relationship with side walls 21 and end plate 25 on upwardly protruding pegs 50. In a preferred embodiment, one or more of the side walls 21 may include openings 26 formed therethrough for receiving leads 40 and 41. The openings 26 may be provided with chambers leading into the openings (not shown) in order to facilitate the assembly of the leads 40 and 41 through openings 26 in the side walls 21. The openings 26 may be arranged in multiple, vertically spaced rows (not shown).

FIG. 2 shows an inner surface of side wall 21c having a step 23 that is aligned with the openings 26 for supporting and locating the row of leads 40 extending through side wall 21c. The side walls 21 are preferably molded from an insulative, polymeric material, such as a liquid crystal polymer. One suitable liquid crystal polymer is VECTRA™ which is available from Hoechst-Celanese. Of course, the housing 120 as well as the connector 130 may be made of any suitable organic or inorganic material or combination of materials. The openings 26 may be molded into the side walls 21 or may be formed after molding by removing material from the side walls 21.

The end plate 25 may be formed of the same material as the side walls 21 and integrally molded with the side walls 21 and lower part 22 of connector 130 to make up base portion 20 of the integrated module 100. Alternatively, the end plate 25 may be formed separately and then attached to side walls 21.

Figure 16:
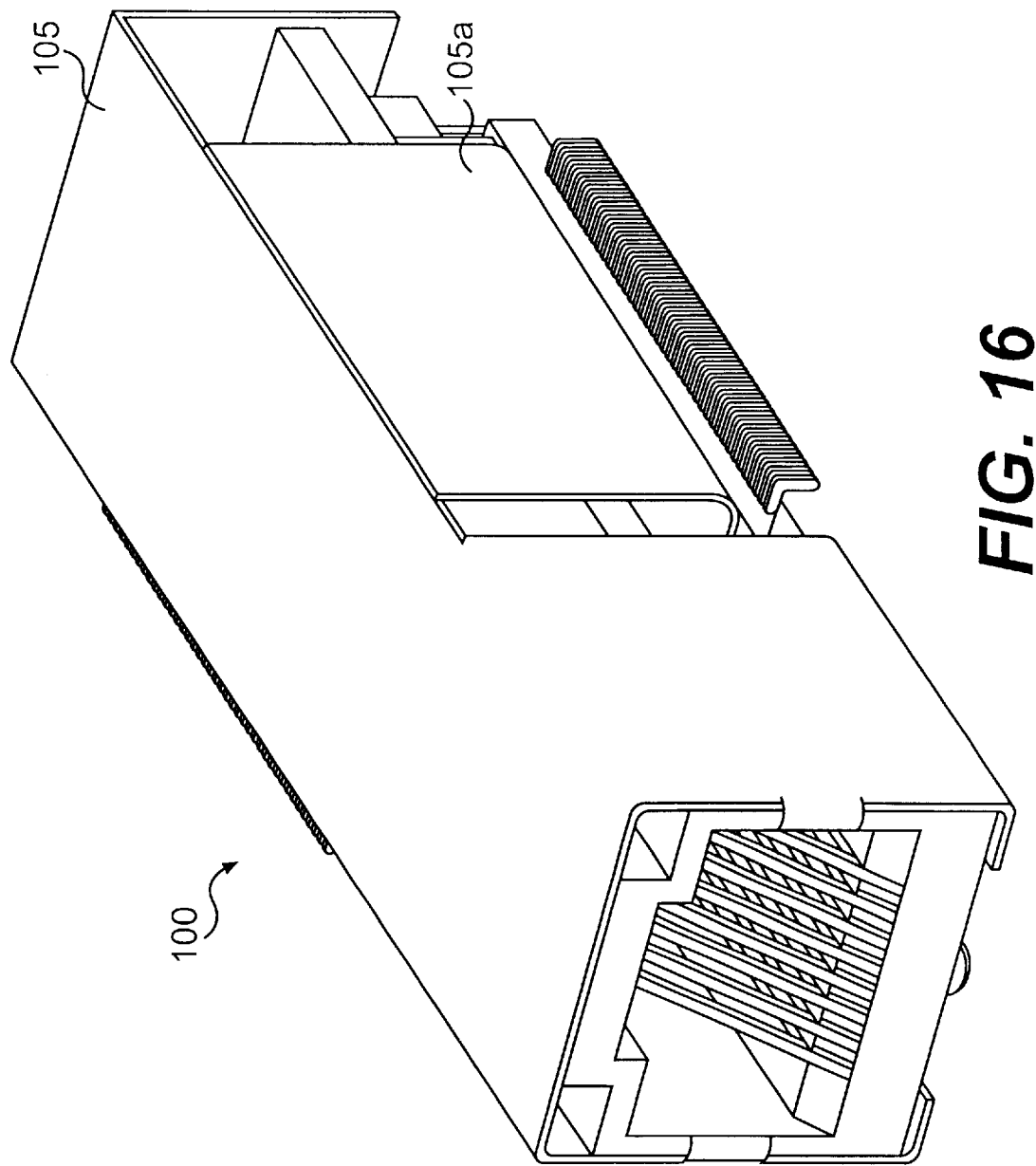
FIG. 16 illustrates an embodiment of the integrated module in accordance with the present invention including shielding.

In a preferred embodiment, the side walls 21 and end plate 25 are made from different materials. For example, the end plate 25 may be made of a heat sink material or combination of materials, such as copper, copper with a diamond coating, copper with a black oxide coating, or other material(s) having a high thermal conductivity. Semiconductor dies or chips (not shown) may be mounted directly to the end plate 25. This enables heat generated by the semiconductor dies to be efficiently transferred to the exterior of the housing 120 through the end plate 25. As shown in FIG. 16, shielding 105 provided around the outer periphery of the integrated module 100 can include a portion 105a that extends downwardly and connects to the end plate 25 to aid in the conduction of heat away from end plate 25.

FIG. 2 illustrates electrically conductive leads 40 extending through side walls 21a and 21b and electrically conductive leads 41 extending through side wall 21d. As shown in FIG. 2, the electrically conductive leads 40, 41 are preferably L-shaped. The electrically conductive leads 40 each include an internal lead section 40a, a stabilizing section (not shown), and an external lead section 40b. The internal lead section 40a resides inside the housing 120. The internal lead section 40a may be relatively narrow compared to the stabilizing section (not shown) passing through the side walls 21 in order to facilitate insertion of the leads into the openings 26 through the side walls 21. Similarly, electrically conductive leads 41 include an internal lead section 41a, a stabilizing section (not shown) passing through side wall 21d, and an external lead section 41b. In the embodiment shown in FIGS. 1–4, the group of leads 41 include external lead sections 41b that are directed upwardly, and the groups of electrically conductive leads 40 include external lead sections 40b that are directed downwardly.

Figure 4:
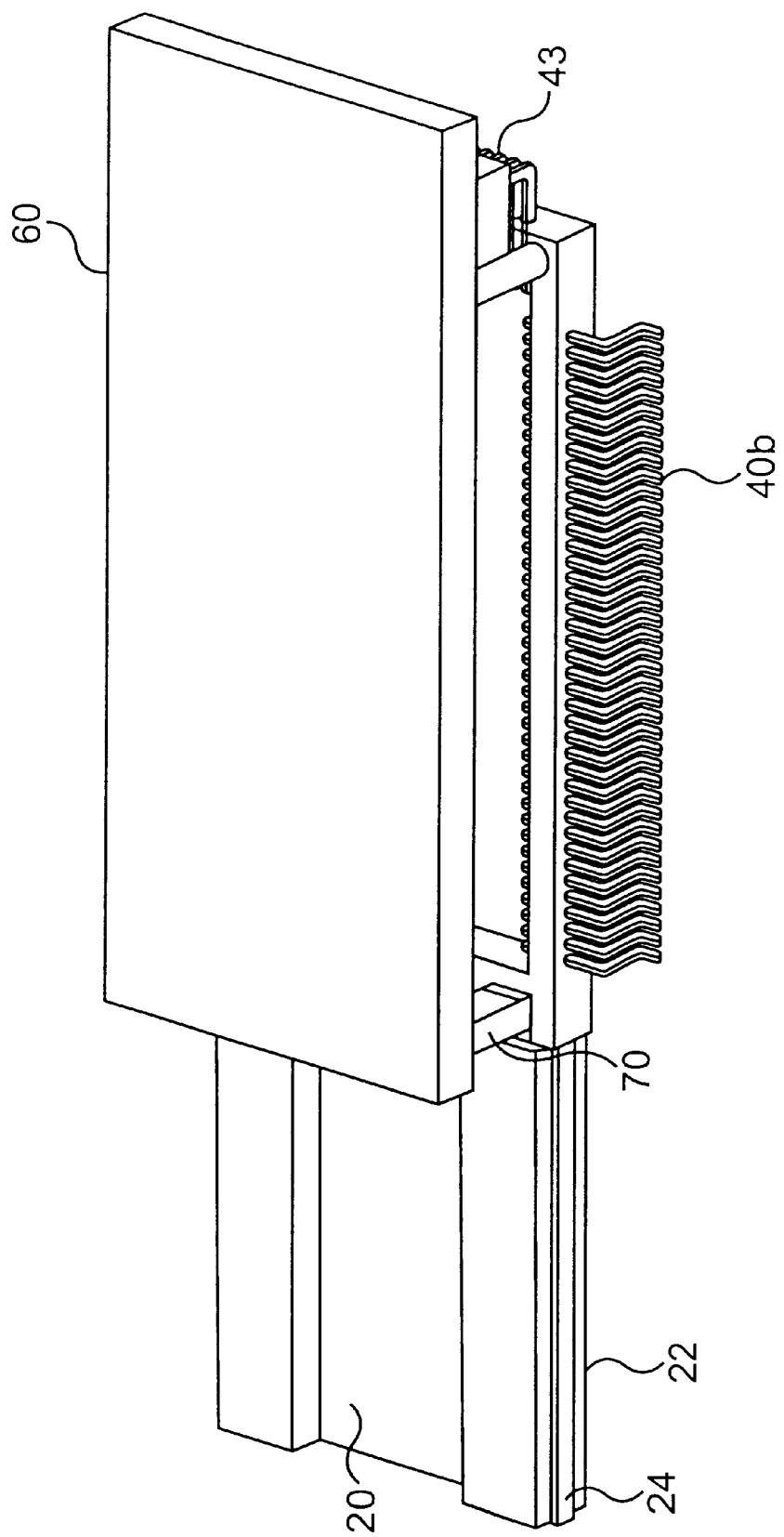
FIG. 4 illustrates a third assembly step in making the integrated module shown in FIG. 1.

Although the embodiment shown in FIGS. 1–4 shows leads 40 and 41 to be arranged in a single row, alternative embodiments could include multiple rows of leads that are vertically spaced to extend through the side walls 21 in vertically spaced tiers. The ends of external lead sections 40b may be shaped for surface mounting to bonding pads on the surface of a printed circuit board or substrate (not shown). Of course, the ends of the external lead sections 40b may be mounted to a printed circuit board or other substrate by other means, such as, for example, plated through hole (PTH) technology. The external lead sections 41b of leads 41 can be inserted into standard box connectors 43, as shown in FIG. 4, which provide a wiping type connection to the leads 41. In a standard box connector, internal electrically conductive contacts are biased against electrical leads inserted into the box connector, thereby rubbing against the as they are inserted and cleaning the contact surfaces. The box connectors 43 provide electrical connection between leads 41 and electrical components mounted on the upper printed circuit board 60. Alternatively, the leads 41 can be directly connected to upper printed circuit boards 60 using surface-mount connections or through-hole connections. The arrangement in the embodiment shown in FIG. 1, with the upper printed circuit board 60 mounted in spaced parallel relationship to end plate 25 on upwardly extending, non-conductive pegs 50, enables the electrical connection of semiconductor dies mounted on end plate 25 near side wall 21d to electrical components mounted on upper circuit board 60 near the box connectors 43, while minimizing the length of electrical path therebetween.

The base portion 20 of integrated module 100 can be formed as one continuous molded piece including bottom part 22 of connector 130 and side walls 21 of housing 120, thus ensuring precision in the relative positioning of internal electrically conductive pins 35 in connector 130, the electrically conductive leads 40 and 41, leads 37 (which can be integral with and extensions of internal pins 35), printed circuit board 60, and the semiconductor dies mounted on end plate 25. As shown in FIG. 2, the side wall 21b connected to the bottom part 22 of connector 130 can be provided with recesses 27 for mounting of light pipes or LEDs 70. Light pipes 70, shown in FIG. 1 extending upwardly from the recesses 27 in the base portion 20 of the integrated module 100, can provide an indicator of the status of various integrated circuits mounted on end plate 25 or an indication of a power on mode.

Figure 8:
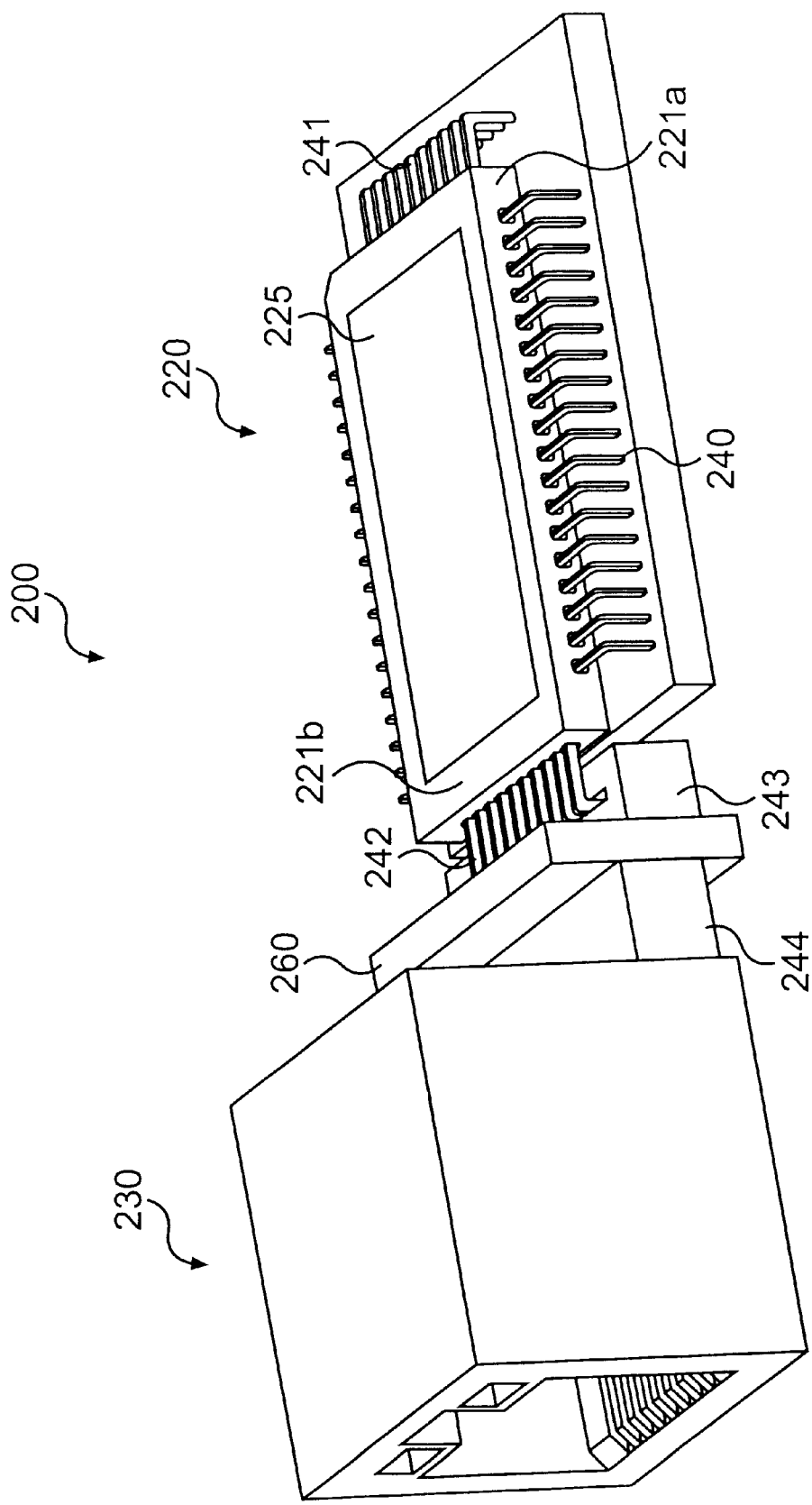
FIG. 8 illustrates a second embodiment of an integrated module in accordance with the invention.
Figure 9:
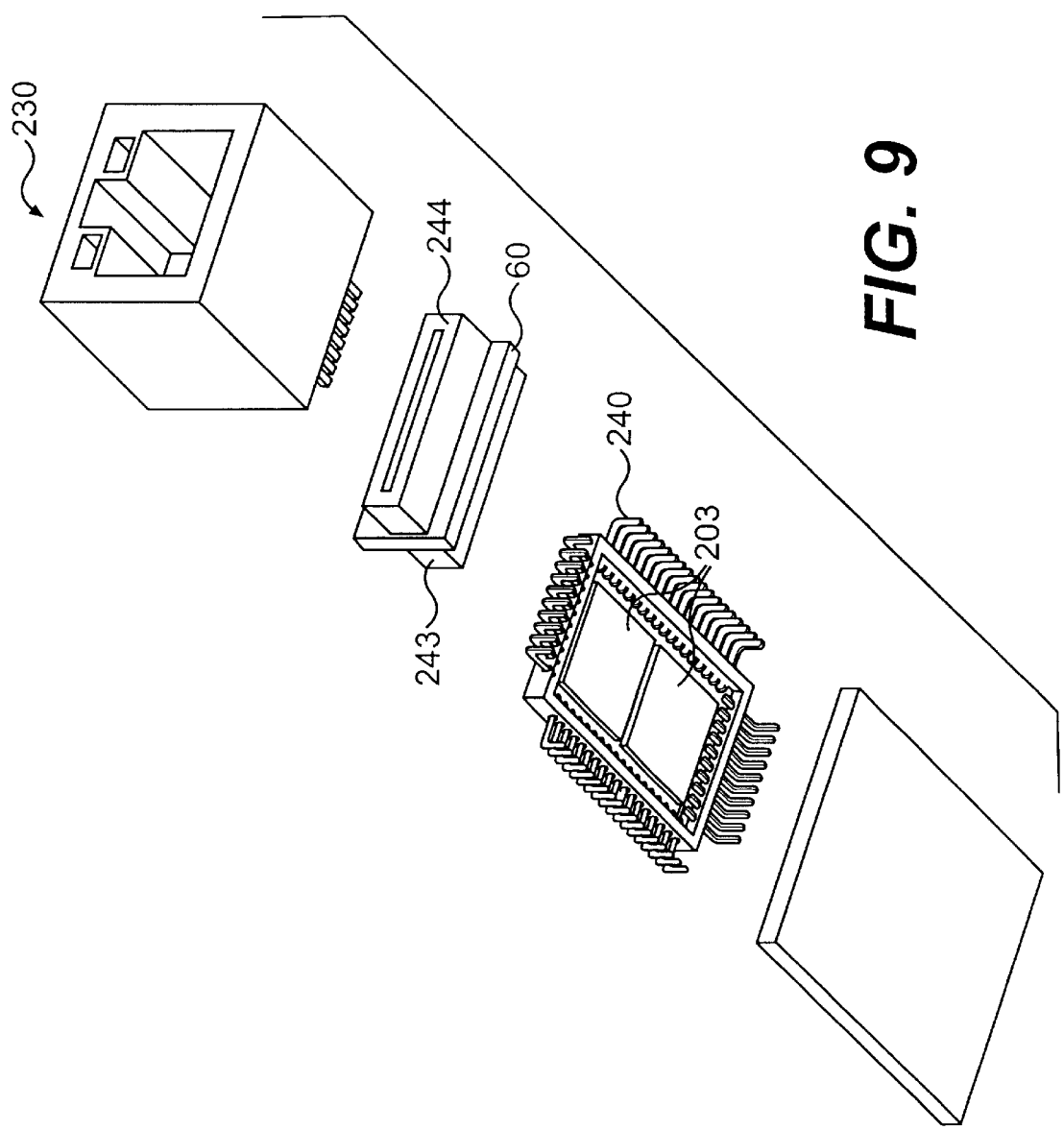
FIG. 9 illustrates an exploded view of the second embodiment of the integrated module shown in FIG. 8.

FIGS. 8 and 9 illustrate a further embodiment of the invention. It should be understood that specific features and manufacturing processes for the housing 120, connector 130 and electrically conductive leads 40, 41, described above in connection with integrated module 100 shown in FIGS. 1–5, are applicable to the present embodiment, but will not be repeated for the sake of brevity. As shown in FIG. 8, a printed circuit board 260 is mounted in a position between the housing 220 and the connector 230. An additional set of L-shaped electrically conductive leads 242 extend through side wall 221b of housing 220 toward connector 230. The electrically conductive leads 242 can be connected electrically to components on printed circuit board 260 through standard box connectors 243. Electrical connection between the pins within connector 230 and printed circuit board 260 can be made through an additional box connector 244. Of course, conductive leads 242 and/or the pins within connector 230 may be electrically connected to circuit board 260 by other means, such as surface-mount connections and through-hole connections. The integrated module 200 shown in FIG. 8 has an overall length that is longer than the integrated module 100 of the first embodiment described above. The exploded view of FIG. 9 shows semiconductor dies 203 mounted on end plate 225.

Figure 10:
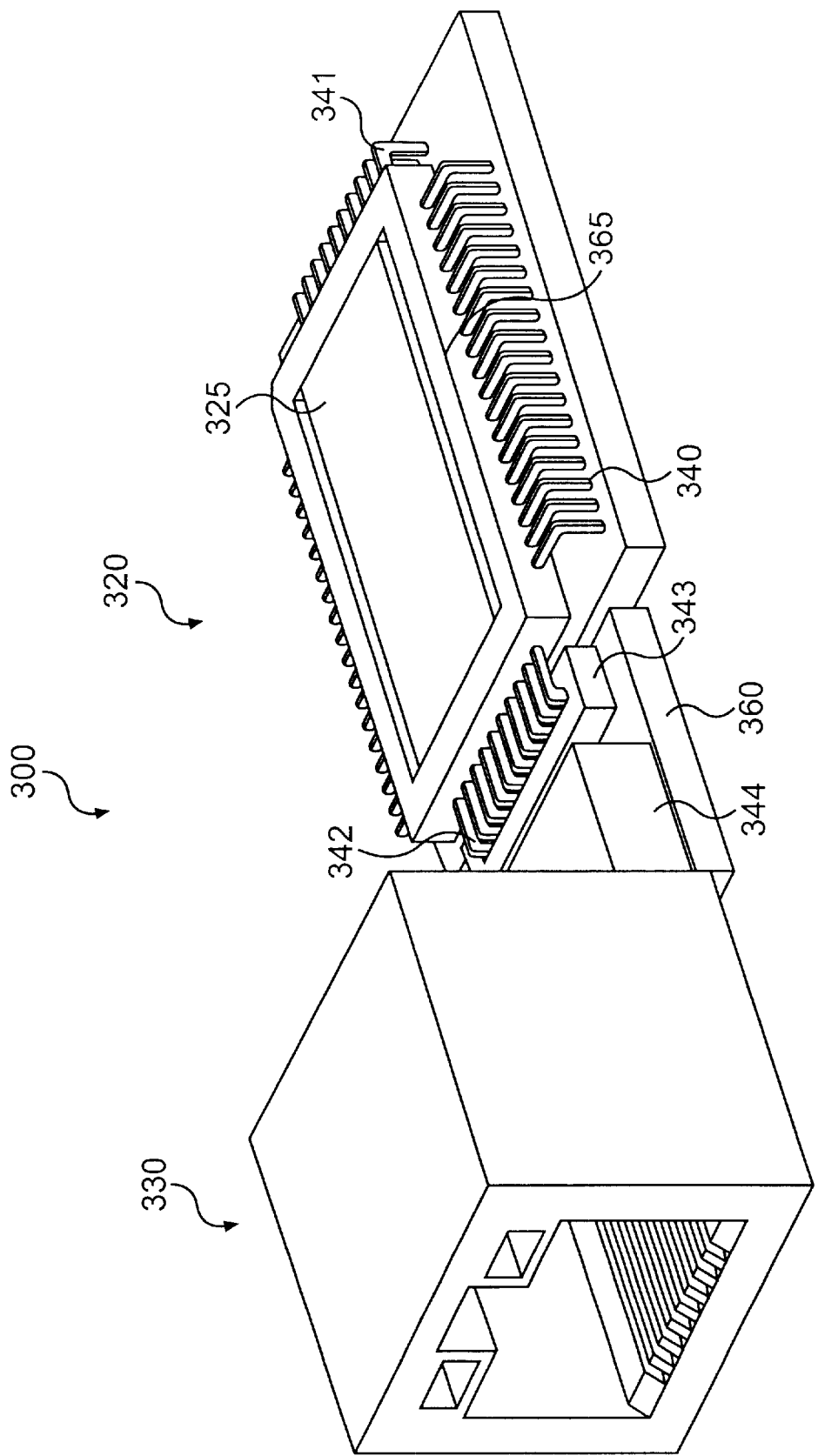
FIG. 10 illustrates a third embodiment of an integrated module in accordance with the invention.

A third embodiment of the invention is shown in FIG. 10. In the embodiment shown in FIG. 10 a printed circuit board 360 is positioned between the connector 330 and housing 320 and is arranged in a direction parallel to a printed circuit board 365 to which the electrically conductive leads 340 and 341 are connected. Electrical connections between the internal electrically conductive pins of connector 330 and the semiconductor die(s) provided on end plate 325 can be made through box connectors 344 and 343. As above, conductive leads 342 and/or the pins within connector 330 may be electrically connected to circuit board 360 by other means, such as surface-mount connections and through-hole connections. The overall length of the integrated module 300 is even longer than the overall length of the integrated modules 200 and 100 shown in FIGS. 8 and 1, respectively.

Figure 11:
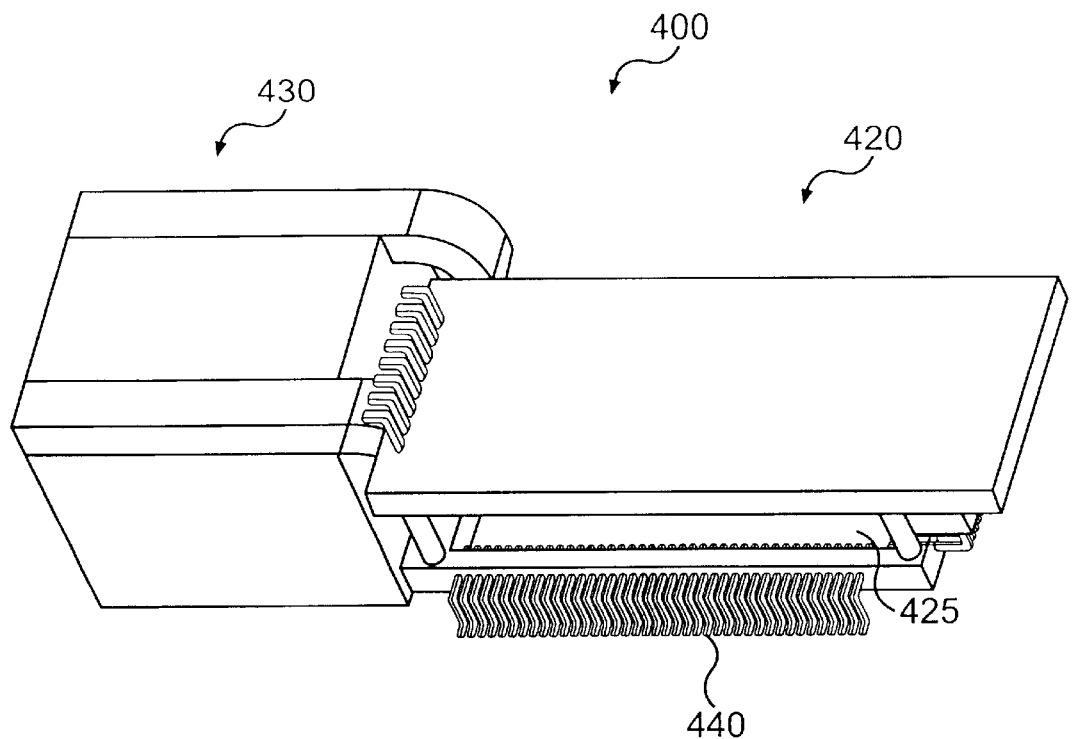
FIG. 11 illustrates a fourth embodiment of an integrated module in accordance with the invention.
Figure 12:
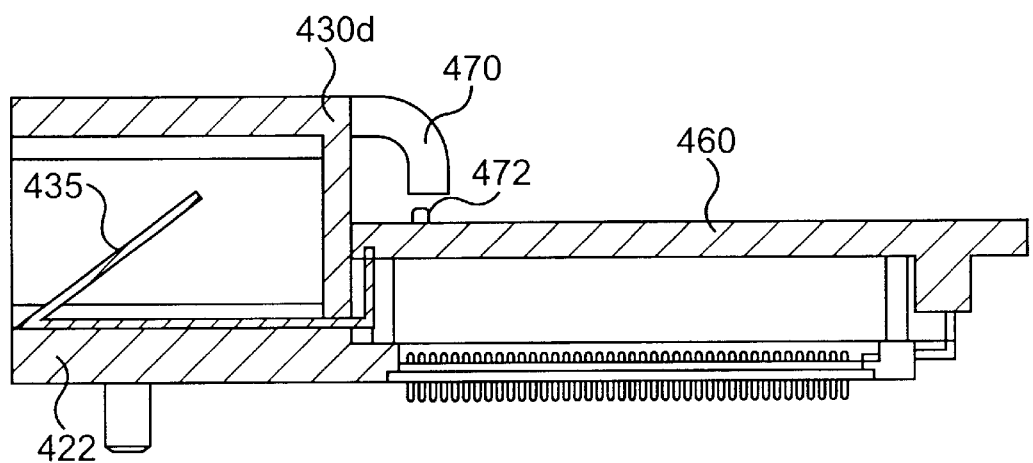
FIG. 12 is a side elevation view in partial cross section of the fourth embodiment shown in FIG. 11.
Figure 13:
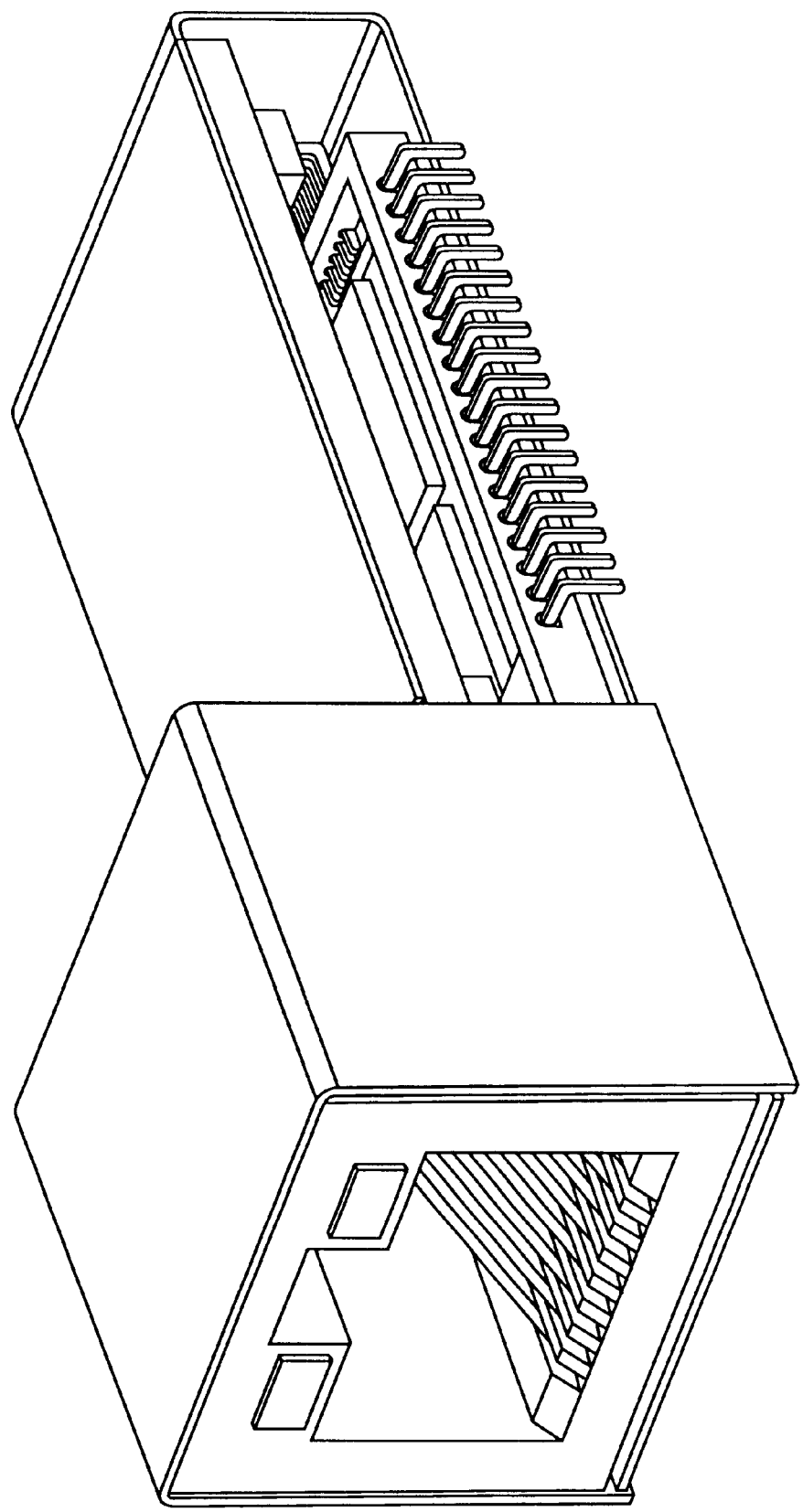
FIG. 13 illustrates a fifth embodiment of an integrated module in accordance with the invention.

FIGS. 11 and 12 show a further embodiment of the invention. Many of the specific features for the housing 120, connector 130 and leads 40, 41, described above in connection with integrated module 100 of FIG. 1, are applicable to the present embodiment, but will not be repeated for the sake of brevity. As shown in FIG. 12, the internal electrically conductive pins 435 of the connector 430 are angled upwardly from the bottom part 422 of connector 430 and rearwardly away from the opening at the front end of the connector 430. The pins 435 extend through the rear wall 430d of connector 430 adjacent the bottom part 422 of the connector 430. The portions of the pins 435 extending through the rear wall of the connector 430 are bent upwardly to make contact with the printed circuit board 460 that is mounted in spaced parallel relationship to the end plate 425 in housing for 420. Light pipes 470 are formed along the top part of connector 430 and curve downwardly to meet with the upper printed circuit board 460. An LED 472 or other electro-optic or opto-electric converting device can be mounted at the interface of the light pipes with the upper printed circuit board. These devices couple optical signals to the components on the circuit board or the semiconductor die, or provide an indicator light for monitoring status of the components.

It will be understood that in all of the above-described embodiments of the invention, the lower portion of the integrated module including the side walls of the housing and the lower part of the connector can be formed as one integral piece or as two separate pieces that are joined together using known processes such as ultrasonic welding.

Figure 14:
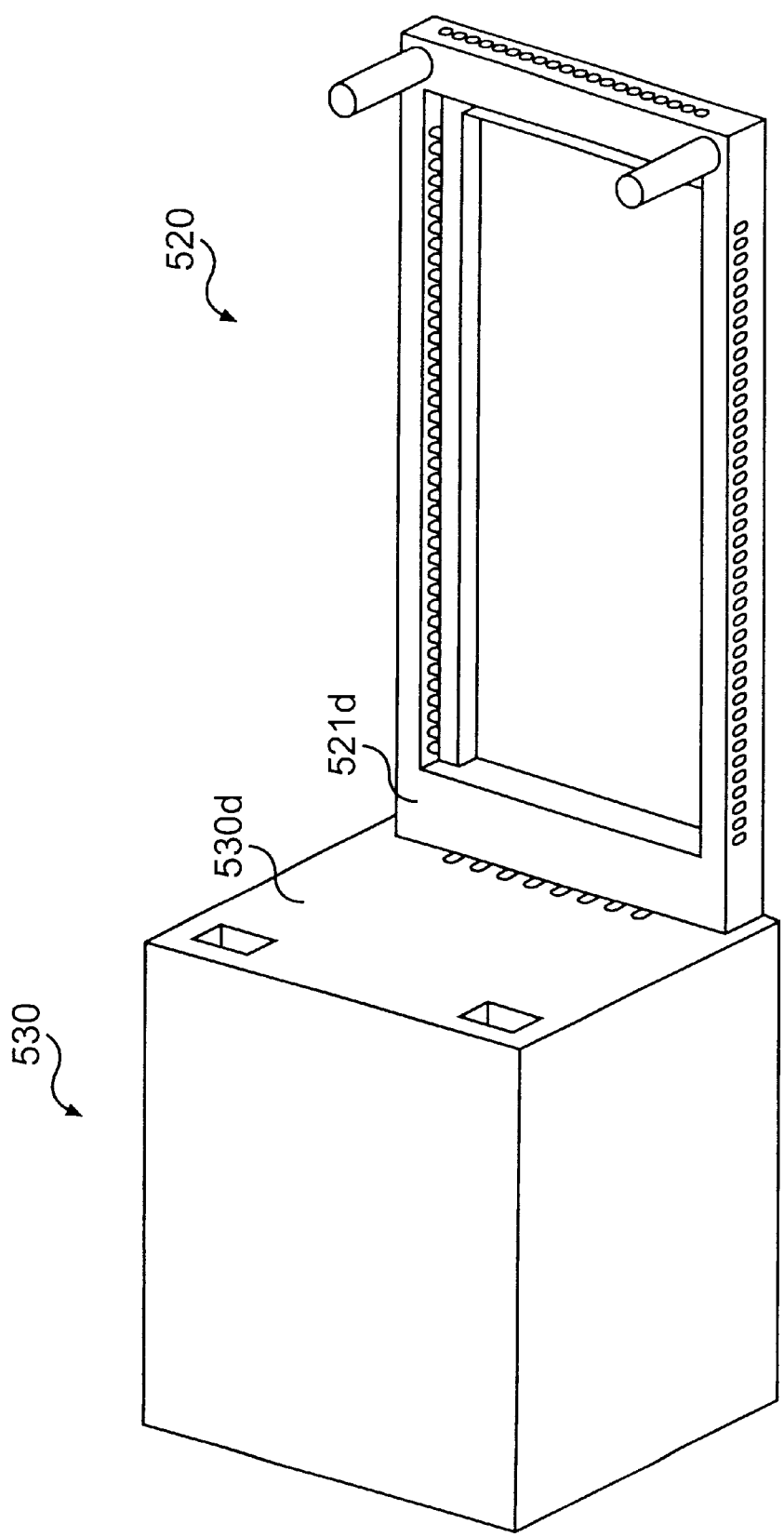
FIG. 14 illustrates an intermediate assembly step in the formation of an integrated module in accordance with the invention.
Figure 15:
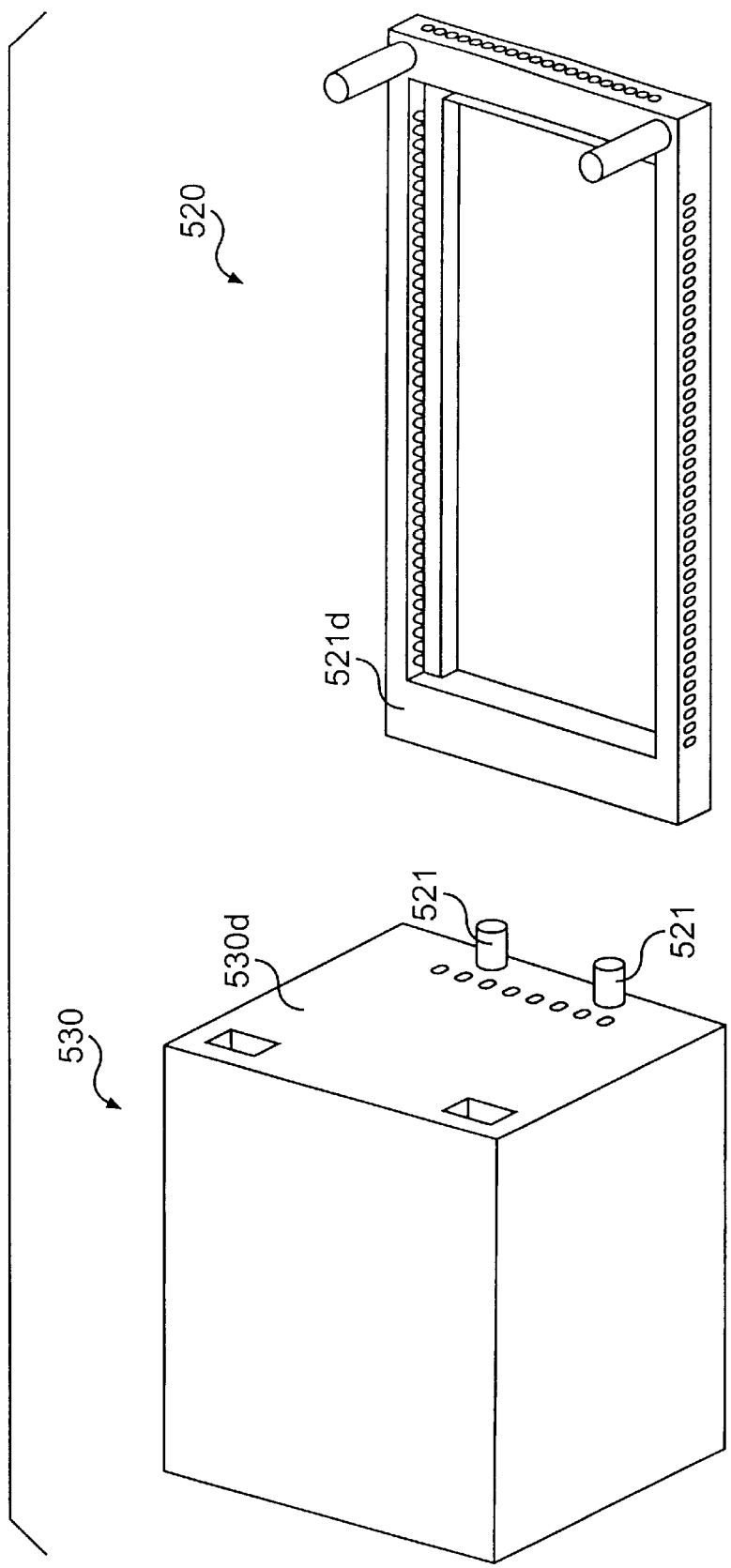
FIG. 15 shows an exploded view of the intermediate assembly shown in FIG. 14.

FIGS. 14 and 15 illustrate features on subcomponents of an integrated module that allow the subcomponents to be joined together by ultrasonic welding to form the integrated module. Protrusions 521 can be provided extending rearwardly from the rear wall 530d of connector 530 for engagement with mating holes in side wall 521d prior to ultrasonic welding during the assemble of an integrated module. It will be understood by one of ordinary skill in the art that a jig (not shown) can be provided to hold the housing portion 520 and connector portion 530 of the integrated module being assembled in FIG. 14 during the joining process.

Figure 17:
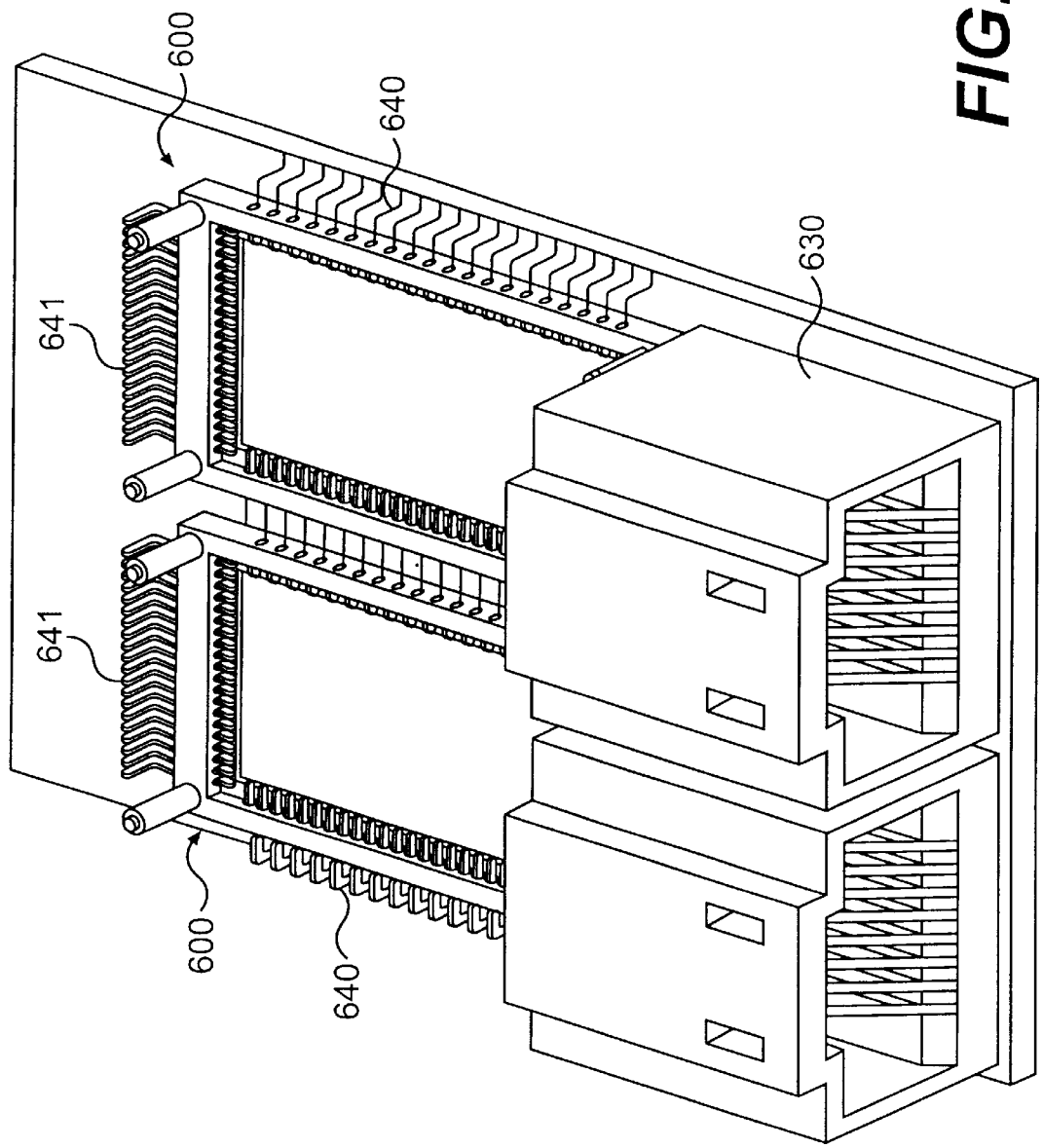
FIG. 17 illustrates a combination of two integrated modules in accordance with an embodiment of the invention having offset electrically conductive leads.
Figure 18:
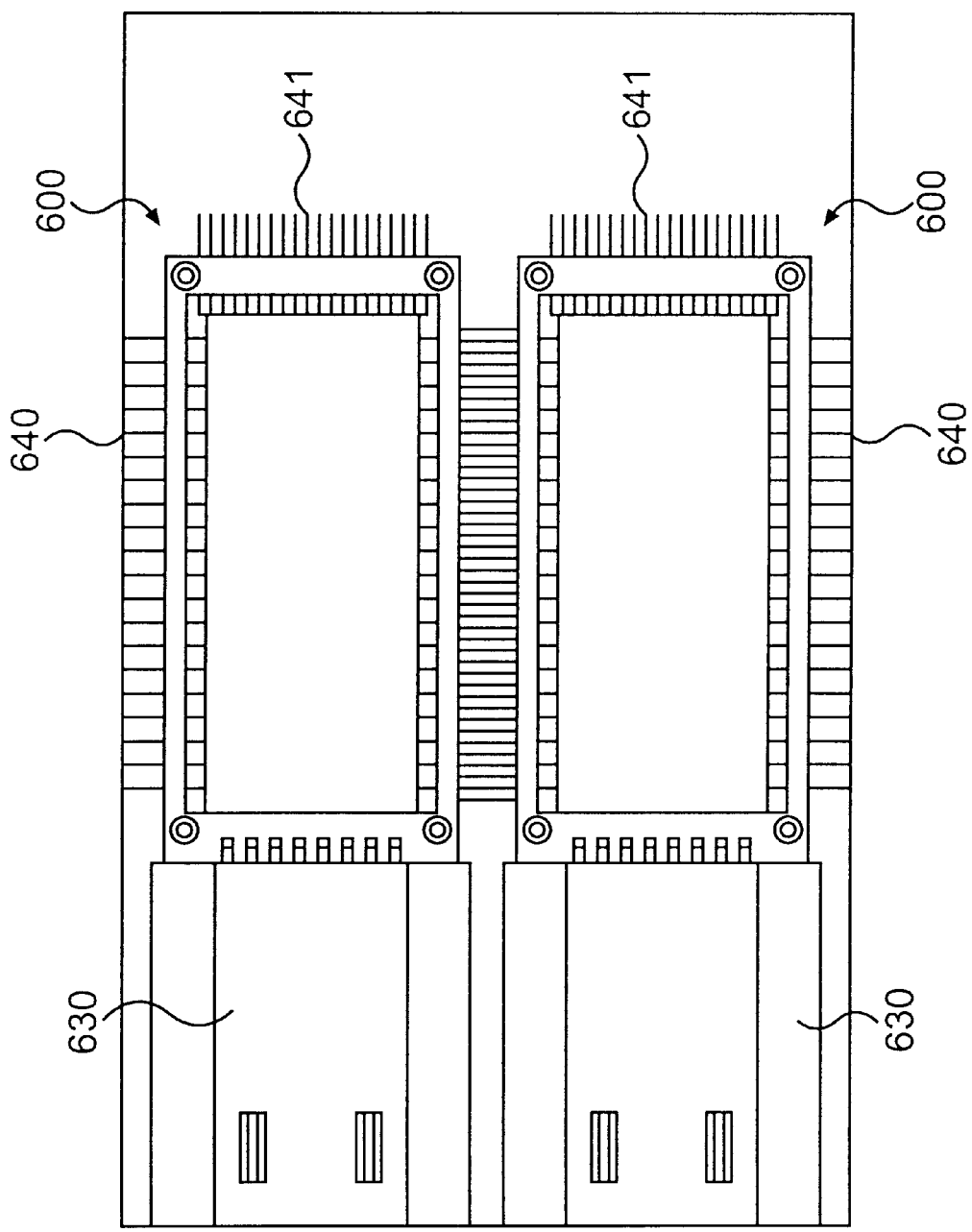
FIG. 18 shows a top view of the embodiment shown in FIG. 17.

As shown in FIGS. 17 and 18, any of the above-described embodiments can be assembled with the electrically conductive leads 640, 641 that extend from the sides of the integrated modules 600 being spaced at a sufficient distance such that two integrated modules can be placed close to each other with the leads 640 overlapping for space optimization. In a preferred embodiment that allows all of the integrated modules for a particular application to be manufactured identically, the leads 640 extending from one side of each module could be offset relative to the leads 640 extending from the opposite side of each module such that when two identical modules are placed immediately next to each other the leads will overlap and allow the two modules to be moved closely together.

It will be apparent to those skilled in the art that various modifications and variations can be made without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated semiconductor die carrier/electrical connector module comprising:

a connector for detachable connection to a signal source, said connector having electrically conductive pins;

a housing defining a cavity for holding at least one semiconductor die, said housing including side walls and an end plate joined to said side walls, said end plate adapted for supporting the at least one semiconductor die;

a plurality of electrically conductive leads extending through at least one of said side walls, each of said leads including an internal lead section extending within the cavity and an external lead section extending externally of said cavity through said at least one side wall, said external lead section adapted for connection with a circuit board with said end plate being located between the at least one semiconductor die and the circuit board; and a portion of said housing being attached to said connector.

2. The integrated module of claim 1, wherein one of said side walls forms said portion of said housing attached to said connector.

3. The integrated module of claim 2, wherein said one of said side walls is integrally molded with at least a portion of said connector.

4. The integrated module of claim 2, wherein said one of said side walls is ultrasonically welded or fused with said connector.

5. The integrated module of claim 1, wherein said connector has an upper part and a lower part, and said lower part is attached to said portion of said housing.

6. The integrated module of claim 5, wherein one of said side walls forms said portion of said housing attached to said lower part of said connector.

7. The integrated module of claim 6, wherein said one of said side walls is integrally molded with said lower part of said connector.

8. The integrated module of claim 6, wherein said one of said side walls is ultrasonically welded to said connector.

9. The integrated module of claim 6, wherein at least one semiconductor die is mounted on said end plate.

10. The integrated module of claim 9, wherein said cavity is defined between said side walls, said end plate and an upper printed circuit board extending in substantially parallel, spaced relationship to said end plate and supported on pegs extending upwardly from at least one of said side walls and said end plate.

11. The integrated module of claim 10, wherein said electrically conductive pins are electrically connected to a first portion of said upper printed circuit board, and a first group of said electrically conductive leads are electrically connected to a second portion of said upper printed circuit board.

12. The integrated module of claim 11, wherein a second group of said electrically conductive leads extend in a direction away from said upper printed circuit board for connection to a second printed circuit board.

13. The integrated module of claim 1, wherein said cavity is defined between said side walls, said end plate and an upper printed circuit board extending in substantially parallel, spaced relationship to said end plate and supported on pegs extending upwardly from at least one of said side walls and said end plate.

14. The integrated module of claim 13, wherein said electrically conductive pins are electrically connected to a first portion of said upper printed circuit board, and a first group of said electrically conductive leads are electrically connected to a second portion of said upper printed circuit board.

15. The integrated module of claim 14, wherein said upper printed circuit board includes passive electrical components and said at least one semiconductor die includes active electrical components.

16. The integrated module of claim 1, wherein a printed circuit board is mounted to said portion of said housing attached to said connector and electrical components mounted on said printed circuit board are electrically connected between said electrically conductive pins and a group of said electrically conductive leads.

17. The integrated module of claim 1, wherein said end plate is made from a heat sink type material.

18. The integrated module of claim 17, wherein an electromagnetic shielding material is provided around the outer periphery of said connector and said housing.

19. The integrated module of claim 18, wherein said electromagnetic shielding material is connected with said end plate and acts as a heat spreader for heat generated by operation of electrical components on said at least one semiconductor die.

20. An integrated semiconductor die carrier/electrical connector module, comprising:

interface means for detachably connecting electrically conductive elements to a signal source;

said interface means being connected to a housing defining a cavity for containing at least one semiconductor die, said housing having electrically insulative side walls and an end plate joined to said side walls, said end plate having an upper surface proximate the cavity for supporting the at least one semiconductor die and a lower surface;

a plurality of electrically conductive leads extending through at least one of said side walls, at least one of said leads adapted for connection with a circuit board with the lower surface proximate the circuit board; and said electrically conductive elements being electrically connected to electrical components of said at least one semiconductor die through a group of said electrically conductive leads.

21. The integrated module of claim 20, wherein a printed circuit board connected to at least one of said side walls includes passive electrical components interposed between said electrically conductive elements and said group of electrically conductive leads.

22. The integrated module of claim 21, wherein said printed circuit board is mounted in substantially parallel, spaced relationship to said end plate and supported on pegs extending upwardly from at least one of said side walls.

23. An integrated semiconductor die carrier/electrical connector module, comprising:

at least one semiconductor die;

a housing defining a cavity for holding the at least one semiconductor die, said housing having a plurality of side walls;

a connector comprising insulative walls, at least one of which being joined to said housing, and electrically conductive pins for detachable connection to a signal source;

electrical signal paths from the electrically conductive pins to the at least one semiconductor die; and a plurality of electrically conductive leads extending through holes in at least one of said side walls, said electrically conductive leads including a substantially L-shaped portion projecting externally of said housing for connection to a circuit board, wherein the semiconductor die is disposed in an upright configuration relative to the circuit board when the leads are connected to the circuit board.

24. The integrated module according to claim 23, wherein said housing further includes an end portion joined to said side walls, said at least one semiconductor die being mounted to said end portion.

25. The integrated module according to claim 23, wherein the electrical signal paths comprise generally L-shaped pins.

26. The integrated module according to claim 24, wherein the generally L-shaped pins are integral with the electrically conductive leads.

27. The integrated module according to claim 23, wherein the electrical signal paths comprise a first connector, a second connector, and a printed circuit board, wherein the first connector is electrically connected to the printed circuit board, and the printed circuit board is electrically connected to the second connector.

28. The integrated module according to claim 27, wherein the first and second connectors are electrically connected to a same side of the printed circuit board.

29. The integrated module according to claim 27, wherein the first and second connectors are electrically connected to different sides of the printed circuit board.

* * * * *